US006527840B1

(12) United States Patent
Igarashi et al.

(10) Patent No.: US 6,527,840 B1
(45) Date of Patent: Mar. 4, 2003

(54) SILVER ALLOY PLATING BATH AND METHOD OF FORMING A SILVER ALLOY FILM BY MEANS OF THE SAME

(75) Inventors: Kazuo Igarashi, Tokyo (JP); Koji Hinomiya, Toyosaka (JP); Takashi Kanda, Niigata (JP)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 09/487,564

(22) Filed: Jan. 19, 2000

(30) Foreign Application Priority Data

Jan. 19, 1999 (JP) ............................................ 11-010879

(51) Int. Cl.[7] .............................................. C23C 18/48
(52) U.S. Cl. ...................................... 106/1.23; 427/436
(58) Field of Search .......................... 106/1.23; 427/436

(56) References Cited

U.S. PATENT DOCUMENTS

| | | | | | |
|---|---|---|---|---|---|
| 3,915,718 | A | * | 10/1975 | Ludwig et al. | ............ 106/1.05 |
| 5,059,242 | A | * | 10/1991 | Firmstone et al. | ......... 106/1.18 |
| 6,183,545 | B1 | * | 2/2001 | Okuhama et al. | .......... 106/1.18 |
| 6,235,093 | B1 | * | 5/2001 | Okuhama et al. | .......... 106/1.18 |
| 6,387,542 | B1 | * | 5/2002 | Kozlov et al. | ............. 106/1.23 |

* cited by examiner

Primary Examiner—Helene Klemanski
(74) Attorney, Agent, or Firm—Peter F. Corless; Darryl P. Frickey; Edwards & Angell, LLP

(57) ABSTRACT

A silver alloy plating bath and a method of forming a silver alloy film by using the silver alloy plating bath and by performing displacement plating on surfaces of a more base metal than silver, the silver alloy plating bath including Ag ions and at least one or more metal ions of Pd ions, Pt ions, Au ions and Rh ions, a concentration of the Ag ions and the metal ion or ions being 0.001 to 0.01 mol/l, a mol ratio of the metal ion or ions to the Ag ions being 1:0.01 to 0.1.

8 Claims, No Drawings

SILVER ALLOY PLATING BATH AND METHOD OF FORMING A SILVER ALLOY FILM BY MEANS OF THE SAME

BACKGROUND OF THE INVENTION

The invention relates to a silver alloy plating bath and a method of forming a silver alloy film by means of the silver alloy plating bath, and, more particularly, to a silver alloy plating bath and a method of forming a silver alloy film by means of the silver alloy plating bath, which plating bath does not contain lead, so that it removes a fear of environmental pollution and is also excellent in working health, in which method printed wiring board are not immersed in a molten solder vessel and so will not be injured due to heat, which silver alloy film is hard to oxidize and is excellent in solderability to thereby eliminate defective contact between printed wiring board and parts being mounted thereon, and which silver alloy film obtained is uniform and free of dispersion to be suitable for manufacturing printed wiring board suited to high density mounting.

Generally, various surface treatment methods are used to provide a protective metallic film on conductor surfaces of printed wiring board in order to prevent oxidation of the conductor surfaces of printed wiring board and degradation of the solderability of the conductor surfaces due to corrosion while electronic parts are packaged on the printed wiring board. These surface treatment methods include a solder leveler treatment. The solder leveler treatment is the most common surface treatment method for printed wiring board, and comprises coating a solder resist on portions of a printed wiring board except soldered lands thereof, and then immersing the printed circuit in a solder vessel, which receives therein a molten tin/lead alloy, to adhere a solder to the land portions not covered by the solder resist. Because an amount of solder adhered is too much as it is, the solder is made in the shape of icicle, and forms a. bridge, hot blast is used to blow off a surplus amount of solder upon withdrawal of the printed wiring board so as to leave a suitable amount of solder on-the printed wiring board.

However, because hot blast is used to blow off a surplus amount of solder, pressure of the hot blast causes the solder to be dispersed in thickness. So, problems have been caused such that the resulting printed wiring board having been subjected to surface treatment is not suited to high density mounting, heat will injure the printed wiring board when the printed wiring board is immersed in a molten solder vessel, and lead contained in solder involves harmfulness which will possibly cause environmental pollution and is problematic in working health to be difficult in future use.

Therefore, modification to other treatment methods than the solder leveler treatment has been demanded, and such other treatment methods include, for example, a gold plating treatment. Although such gold plating treatment is advantageous for high density mounting of printed wiring board, the manufacturing cost is problematically high. Accordingly, a silver plating treatment is sometimes performed which is higher in electric conductivity and more advantageous in cost than gold. However, the silver film obtained is unstable and liable to oxidize, and the oxidized silver film is inferior in solderability, so that there is caused a problem of possible defective contacts between printed wiring board and parts being mounted thereon.

The inventors of this application has performed earnest investigation so as to solve the above problems, found that the above problems are solved by depositing on a copper surface silver together with a more noble metal, for example, at least one metal selected from a group consisting of palladium, platinum, gold and rhodium, to form a silver alloy film, and devised the invention.

SUMMARY OF THE INVENTION

Accordingly, it is an object of the invention to provide a silver alloy plating bath and a method of forming a silver alloy film by means of the silver alloy plating bath, which plating bath does not contain lead, so that it removes a fear of environmental pollution and is also excellent in working health, in which method printed wiring board are not immersed in a molten solder vessel and so will not be injured due to heat, which silver alloy film is hard to oxidize and is excellent in solderability to thereby eliminate defective contacts between printed wiring board and parts being mounted thereon, and which silver alloy film obtained is free of dispersion to be suited for manufacturing printed wiring board.

The silver alloy plating bath according to the invention includes at least silver ions and at least one metal ion selected from a group consisting of palladium ions, platinum ions, gold ions and rhodium ions, the silver ions and the at least one metal ion having a concentration of 0.001 to 0.01 mol/l, and a ratio (mol ratio) of the at least one metal to the silver ion being 1:0.01 to 0.1. The method of forming a silver alloy film, according to the invention, has a feature in that the silver alloy plating bath of the invention is used to form a silver alloy film on surfaces of a more base metal than silver by means of displacement plating.

A silver ion source for the silver ions used in the silver alloy plating bath according to the invention suffices to be a water soluble silver salt, examples of which can be silver nitrate, silver acetate, silver sulfate, silver lactate, silver benzoate, silver nitrite, silver carbonate, silver thiocyanate, silver phosphate, silver citrate and the like. Preferably, the silver ions source includes silver nitrate and silver sulfate.

An ion source for palladium ions, platinum ions, gold ions or rhodium ions, used in the silver alloy plating bath according to the invention, suffices to be a water soluble salt, examples of which can be a water soluble palladium salt such as palladium(II) nitrate, palladium(II) sulfate, palladium(II) acetate, tetraamminepalladium(II) nitrate and the like, a water soluble platinum salt such as tetraammine platinum(II) nitrate, diaminedinitroplatinum(II), bisethanol ammoniumplatinum(II) hydroxide and the like, a water soluble gold salt such as potassium dicyanoaurate(I), potassium tetracyanoaurate(III), gold(I)cyanide and the like, and a water soluble rhodium salt such as rhodium(III) nitrate, rhodium(III) acetate and the like. Preferably, the ion source includes palladium(II) nitrate, rhodium(III) nitrate, tetraammineplatinum(II) nitrate and potassium tetracyanoaurate(III).

The silver ion and the at least one metal ion selected from a group consisting of palladium ions, platinum ions, gold ions and rhodium ions, in the silver alloy plating bath according to the invention, have a concentration of 0.001 to 0.01 mol/l. The reason for this is that when the concentration exceeds 0.01 mol/l, the plating bath becomes unstable, and when the concentration is less than 0.001 mol/l, silver and palladium, platinum, gold or rhodium become hard to deposit and the silver alloy film becomes hard to form. The concentration is preferably 0.003 to 0.009 mol/l and is most preferably 0.005 to 0.007 mol/l.

Preferred silver plating baths comprise at least silver ions and at least one metal ion selected from a group consisting of palladium ions, platinum ions, gold ions and rhodium ions, wherein the silver ions and the at least one metal ion have a concentration of 0.003 to 0.009 mol/l, and a mole ratio of the at least one metal ion to the silver ions is 1:0.3 to 0.09. Additional preferred silver plating baths comprise at least silver ions and at least one metal ion selected from a group consisting of palladium ions, platinum ions, gold ions and rhodium ions, wherein the silver ions and the at least one metal ion have a concentration of 0.005 to 0.007 mol/l, and a mole ratio of the at least one metal ion to the silver ions is 1:0.05 to 0.07.

A ratio (mol ratio) of at least one metal ion selected from a group consisting of palladium ions, platinum ions, gold ions and rhodium ions to silver ions in the silver alloy plating bath according to the invention is 1:0.01 to 0.1. The reason for this is that, when the ratio (mol ratio) of the at least one metal ion to the silver ions exceeds 0.1, a composition of a silver alloy film formed on surfaces of a more base metal than silver by the method using the silver alloy plating bath according to the invention is made:outside a range of composition described later, and palladium, platinum, gold, rhodium and the like on surfaced of the silver alloy film become high in ratio to make tone and solderability of the metal surfaces worse and to increase cost, and when the ratio (mol ratio) is less than 0.01, palladium, platinum, gold or rhodium becomes hard to deposit. The ratio (mol ratio) is preferably 1:0.02 to 0.08 and is most preferably 1:0.03 to 0.07.

A complexing agent is contained in the silver alloy plating bath according to the invention in order to prevent a silver alloy film formed on the metal surfaces from becoming porous, non-flat and degraded in adhesion property since the displacement reaction process excessively and rapidly. The complexing agent suffices to enable complexing silver ions, palladium ions, platinum ions, gold ions and rhodium ions, and can include, for example, aminocarboxylic acid such as ethylenediaminetetraacetic acid, diethylenetriaminepentaacetic acid, triethylenetetraaminehexaacetic acid. N-(2-hydroxylethyl) iminodiacetic acid, hydroxylethyl glycine, nitrilotriacetic acid or N-(2-hydroxylethyl) ethylenediaminetriacetic acid; or aminophosphonic acid such as aminotri(methylenephosphonic acid), ethylenediaminetetra(methylenephosphonic acid), hexamethylenediaminetetra(methylenephosphonic acid) or nitrilotris(methylenephosphonic acid). The complexing agent may comprise a mixture of one or two or more of these chemicals. The complexing agent is preferably diethylenetriaminepentaacetic acid. The plating bath according to the invention contains a sufficient amount of the complexing agent to make silver ions, palladium ions, platinum ions, gold ions and rhodium ions in the silver alloy plating bath, a complex compound. Accordingly, the complexing agent is existent in equal mol quantities of silver ions and at least one metal ion selected from a group consisting of palladium ions, platinum ions, gold ions and rhodium ions. Preferably, the complexing agent is existent in a more amount than a stoichiometric amount required to completely complex silver ions, palladium ions, platinum ions, gold ions and rhodium ions. Thus a ratio (mol ratio) of a concentration of the complexing agent to a concentration of silver ions and at least one metal ion selected from a group consisting of palladium ions, platinum ions, gold ions and rhodium ions is 1:1 to 100, preferably 1:2 to 80 and most preferably 1:5 to 50.

The surface active agent is contained in the silver alloy plating bath according to the invention in order to reduce surface tension of the plating bath to make the deposited film uniform in thickness, and the kind of the surface active agent, being not limitative, can include an anionic surface active agent such as polyoxyethylene alkyl ether carboxylic acid, alkyl ether sulfate, alkylbenzenenesulfonate and polyoxyethylene alkyl ether phosphate; a cationic surface active agent such as higher alkylamine salt and a quarternaly alkylammqnium salt; an amphoteric surface active agent such as aminocarboxylate. imidazolin derivative and the like; and a nonionic surface active agent such as polyoxyethylene alkylamine, polyoxyethylene glycol fatty acid ester, polyoxyethylene alkyl phenyl ether and the like. The surface active agent may comprise a mixture of one or two or more of these chemicals. The surface-active agent is preferably polyoxyethylene alkyl phenyl ether.

The reason why the silver alloy plating bath according to the invention has a pH of 6.0 to 10.0 is that, when the pH of the silver alloy plating bath is less than 6.0, the plating bath becomes unstable, and when the pH exceeds 10.0, the silver alloy film becomes hard to form. The pH of the silver alloy plating bath is preferably 6.0 to 9.0 and is most preferably 6.5 to 8.0. A pH adjusting agent for adjusting the pH of the silver alloy plating bath can, include sodium hydroxide, potassium hydroxide, lithium hydroxide and the like, and is preferably sodium hydroxide and potassium hydroxide.

The silver alloy plating bath according to the invention may contain buffer as desired to keep the pH of the silver alloy plating bath within a desired range. The buffer may be one which does not react with silver ions, palladium ions, platinum ions, gold ions and rhodium ions to generate precipitation, and can include, for example, carbonic acid and sodium carbonate, and acetic acid and sodium acetate and the like.

The silver alloy plating bath according to the invention can be manufactured in the following manner. Thus the above-described water.-the complexing agent and the surface active agent are first added into a non-metallic tank and then the above-described water soluble silver salt and at least a water soluble salt selected from palladium salt, platinum salt, gold salt and rhodium salt are added in the form of water solution to provide a desired concentration of silver ions and one metal ion selected from palladium ions, platinum ions, gold ions and rhodium ions, a desired ratio (mol ratio) of at least one metal ion selected from palladium ions, platinum ions, gold ions and rhodium ions to silver ions, a desired mol concentration of the complexing agent and a desired concentration of the surface active agent. Thereafter the pH adjusting agent is added to provide a desired pH. Subsequently the silver alloy plating bath obtained suffices to be heated to a reaction temperature, for example, 45 to 50° C.

The method of forming a silver alloy film, using the silver alloy plating bath of the invention, comprises performing beforehand the degreasing treatment of surfaces of a more base metal than silver by means of a degreasing liquid prior to the displacement plating. In the degreasing treatment, oil and oxides are removed from the surfaces of the more bese metal than silver to thereby obtain a silver alloy film of uniform thickness on the surfaces of the more base metal than silver. The manner of degreasing treatment suffices exemplarily to bring the degreasing liquid with into contact with the surfaces of the more base metal than silver as by immersion, spraying or coating. An acid, neutral or basic degreasing liquid can be used as the degreasing liquid, and the acid degreasing liquid is preferably used. The acid degreasing liquid can include ACID CEANER 1022-B, ACID CEANER 811-B, PREPOSIT SPRAY CLEANER R742 and the like, manufactured by Shiplay Far East Company. The degreasing liquid is at room temperature to 70° C., and is preferably 60° C.

The more base metal than silver applied to the method of the invention is, for example, copper, brass and other copper alloys, aluminum, nickel, tin, iron, zinc and the like, and is not particularly limited in shape.

Subsequently, the more base metal than silver having been subjected to the degreasing treatment are washed to get rid of the degreasing liquid, and then a chemical polishing liquid is used for specular treatment. The specular treatment is a pretreatment for performing uniform specular finishing of the metal surfaces, and the surfaces of the more base metal than silver may be brought into contact with the chemical polishing liquid as by immersion, spraying or coating. The metal surfaces obtained by the specular treatment is required to have a surface roughness of 1 $\mu$m or less for printed wiring board.

The chemical polishing liquid can include, for example, CHEM-POLISH 151L-2, CHEM-POLISH 152, CHEM-POLISH 153, CHEM-POLISH 14 and the like, manufactured by Shiplay Far East Company. The chemical polishing liquid is freely variable in etching speed depending upon a concentration and a mixing ratio, and is preferably a mixed solution of 500 to 600 g/l of sulfuric acid and 200 to 280 g/l of sodium nitrate. The chemical polishing liquid has a liquid temperature corresponding to from room temperature to 35° C. and preferably 23 to 27° C. A time of period for treatment in the chemical polishing liquid is 10 seconds to 2 minutes and preferably 10 to 60 seconds.

Subsequently, in order to remove an oxide coating from the metal surfaces and prevent a washing liquid at the time of washing from mixing into a plating liquid after the surfaces of the more base metal than silver, having been subjected to specular finishing, are washed, it is preferable to perform the predipping treatment by immersing the more base metal than silver in an aminocarboxylic acid solution or an aminophosphonic acid solution or a mixture thereof. The aminocarboxylic acid solution or aminophosphonic acid solution used in the predipping treatment may be a mixture of one or two or more of aminocarboxylic acid or aminophosphonic acid, and their concentrations are normally 0.005 to 1 mol/l, and are preferably 0.02 to 0.5 mol/l. The aminocarboxylic acid solution has normally a liquid temperature of 20 to 50° C. and a treatment time of 1 to 2 minutes.

It suffices to subsequently perform displacement plating of the surfaces of the more base metal than silver by contacting them with the silver alloy plating bath according to the invention as by immersion, spraying or coating until a silver alloy film having a desired-thickness is formed. The film thickness of the silver alloy film thus obtained is normally 0.05 to 0.2 $\mu$m, preferably 0.07 to 0.15 $\mu$m. A period of time required to obtain the silver alloy film having such thickness is normally 1 to 10 minutes, preferably 2 to 7 minutes. A temperature of the plating bath affects a deposition speed of the silver alloy and a thickness of the silver alloy film, and is normally 20 to 60° C., preferably 25 to 50° C.

A silver alloy film formed on the metal surfaces by means of the method using the silver alloy plating bath according to the invention is composed of.90.0 to 99.9 wt. % of silver and 0.1 to 10 wt. % of at least one metal selected from a group consisting of palladium, platinum, gold and rhodium. When the silver content is less than 90.0 wt. %, a ratio of at least one metal selected from a group consisting of palladium, platinum, gold and rhodium becomes large on the surfaces of the silver alloy film to make tone and solderability of the metal surfaces worse and to increase cost. When the silver content exceeds 99.9 wt. %, silver is liable to oxidize, so that the solderability of the metal surfaces becomes worse. Preferably, the silver alloy film is composed of 95.0 to 99.5 wt. % of silver and 0.5 to 5 wt. % of at least one metal selected from a group consisting of palladium, platinum, gold and rhodium.

Since the silver alloy plating bath according to the invention and the silver alloy film formed by means of the method using the plating bath do not contain lead, they remove a fear of environmental pollution and are excellent in working health. Also, because the silver alloy film obtained is formed by displacement plating, there is no need of immersing printed wiring board in a molten solder vessel as in the solder leveler. Accordingly, printed wiring board will not be injured due to heat. Further, because the silver alloy film obtained contains at least one metal selected from a group consisting of palladium, platinum, gold and rhodium, it is harder to oxidize than a silver film and is excellent in solderability. Accordingly, there is involved no defective contact between printed wiring board and parts being mounted thereon. Besides, the method of forming a silver alloy film, according to the invention, provides a silver alloy film which is uniform, flat and free of dispersion, because the degreasing treatment making use of a degreasing liquid and the specular treatment making use of a chemical polishing liquid are beforehand effected prior to the displacement plating. Accordingly, printed wiring board can be obtained which are suitable for high density mounting.

In order to solder load parts on the silver alloy film obtained by the method of the invention, any solder commonly used is available but a solder not containing lead, for example, tin/silver, tin/bismuth/silver/copper and tin/bismuth/silver, is preferable in terms of harmfulness of lead.

DESCRIPTION OF THE PREFERRED EMBODIMENTS

An embodiment of the invention will be hereinbelow described but the invention is not limited thereto.

EXAMPLE 1

Manufacture of silver/palladium alloy plating bath

Polyoxyethylene nonylphenyl ether and diethylenetriaminepentaacetic acid were dissolved in a deionized water, and then agitated and dissolved with addition of silver nitrate, to which solution obtained is added a solution obtained by dissolving palladium(II) nitrate into a mixture of nitric acid and pure water. Subsequently, sodium hydroxide was added to the resulting solution to adjust pH thereof. A silver alloy plating bath obtained is composed of 1 g/l (0.006 mol/l) of silver nitrate, 0.02 g/l ($8.7 \times 10^{-5}$ mol/l) of palladium nitrate (II), 20 g/l (0.05 mol/l) of diethylenetriaminepentaacetic acid, and 1 g/l of polyoxyethylene nonylphenyl ether.

Formation of silver/palladium alloy film

An IPC test pattern substrate was immersed in a water solution, which contained 15 wt. % of ACID CLEANER 811-B (trade name, manufactured by Shiplay Far East Company) and 5 wt. % of concentrated sulfuric acid, at 45° C. for two minutes, and was subjected to degreasing. Subsequently, after washing of two minutes, the substrate was immersed in an etching solution CHEM-POLISH 151L-2 (trade name, manufactured by Shiplay Far East Company) at room temperature for 30 seconds for specular treatment and then washed for two minutes. The copper surface of the IPC test pattern substrate obtained had a surface roughness of 0.2 μm. Subsequently, the substrate was immersed in a water solution, which contained 20 g/l of diethylenetriaminepentaacetic acid, at room temperature for 1 minute, and then was immersed in the silver/palladium alloy plating bath, which was manufactured in the previous process, at 45° C. for 3 minutes for displacement plating. The IPC test pattern substrate was taken out of the silver alloy plating bath, and washed to be dried. Thus formed on a conductor of the IPC test pattern substrate was a glossy, flat silver/palladium alloy film. The resulting silver/palladium alloy film was composed of 98 wt. % of silver and 2 wt. % of palladium, and had a film thickness of 1.3 μm.

Discoloring of silver/palladium film

The IPC test pattern substrate formed with the silver/palladium alloy film was left in an atmosphere, having a relative humidity of 90%, at 40° C. for 24 hours, and discoloring of the silver/palladium film was visually observed, a result of which is indicated in TABLE 1.

Evaluation of solderability

The IPC test pattern substrate formed with the silver/palladium alloy film was evaluated in terms of solderability on the basis of Meniscograph method. More specifically, the IPC test pattern substrate formed with the silver/palladium alloy film was immersed in a preflux for 3 seconds, and caused to drip water off for 5 seconds. Subsequently, the substrate was heated at 3° C./sec. and held and preheated at 150° C. for 80 seconds. Subsequently, the substrate was immersed in a molten solder, which was composed of tin 90/bismuth 7.5/silver 2/copper 0.5 and had a temperature of 245° C., to be subjected to soldering. A solderability of the substrate was evaluated in terms of dynamic wetting time. The result is indicated in TABLE 1. It is preferable that the dynamic wetting time is short.

EXAMPLE 2

A silver alloy plating bath was manufactured in the same manner as in Example 1 except that 0.034 g/l ($8.7 \times 10^{-5}$ mol/l) of tetraammineplatinum(II) nitrate was used in place of palladium(II) nitrate, and a silver alloy film was formed on a conductor of the IPC test pattern substrate in the same manner as in Example 1. The silver alloy film was evaluated in terms of discoloring and solderability in the same manner as in Example 1. The result is indicated in TABLE 1.

EXAMPLE 3

A silver alloy plating bath was manufactured in the same manner as in Example 1 except that 0.025 g/l ($8.7 \times 10^{-5}$ mol/l) of rhodium(III) nitrate was used in place of palladium (II) nitrate, and a silver alloy film was formed on a conductor of the IPC test pattern substrate. The silver alloy film was evaluated in terms of discoloring and solderability in the same manner as in Example 1. The result is indicated in TABLE 1.

Comparative Example 1

A silver alloy plating bath was manufactured in the same manner as in Example 1 except that palladium(II) nitrate was not added, and a silver alloy film was formed on a conductor of the IPC test pattern substrate. The silver. alloy film was evaluated in terms of discoloring and solderability in the same manner as in Example 1. The result is indicated in TABLE 1.

TABLE 1

| | Example | | | Comparative Example |
|---|---|---|---|---|
| | 1 | 2 | 3 | 1 |
| Composition of plating bath | | | | |
| silver ion (mol/l) | $5.9 \times 10^{-3}$ | $5.9 \times 10^{-3}$ | $5.9 \times 10^{-3}$ | $5.9 \times 10^{-3}$ |
| palladium ion (mol/l) | $8.7 \times 10^{-5}$ | — | — | — |
| platinum ion (mol/l) | — | $8.7 \times 10^{-5}$ | — | — |
| rhodium ion (mol/l) | — | — | $8.7 \times 10^{-5}$ | — |
| silver: (palladium, platinum, gold, rhodium) | 1:0.015 | 1:0.015 | 1:0.015 | — |
| diethylenetri-aminepentaacetic acid (mol/l) | 0.05 | 0.05 | 0.05 | 0.05 |
| polyoxyethylene nonylphenyl ether (g/l) | 1 | 1 | 1 | 1 |
| pH | 7 | 7 | 7 | 7 |
| Bath temperature (° C.) | 45 | 45 | 45 | 45 |
| Plating time (minute) | 3 | 3 | 3 | 3 |
| Composition of film | | | | |
| Silver | 98 | 98 | 99 | 100 |
| Palladium (wt. %) | 2 | — | — | — |
| Platinum (wt. %) | — | 2 | — | — |
| Rhodium (wt. %) | — | — | 1 | — |
| Film thickness (μm) | 1.3 | 1.2 | 1.1 | 1.3 |
| Discoloring of film | Not Observed | Not Observed | Not Observed | Observed |
| Soldering quality (second) | 0.6 | 0.6 | 0.6 | 0.7 |

As apparent from the above description, since the silver alloy plating bath according to the invention and the silver alloy film formed by means of the method using the plating bath do not contain lead, they remove a fear of environmental pollution and are excellent in working health. Also, since the silver alloy film obtained is formed by displacement plating, there is no need of immersing printed wiring board in a molten solder vessel as in the solder leveler. Accordingly, printed wiring board will not be injured due to heat. Further, because the silver alloy film obtained contains at least one metal selected from a group consisting of palladium, platinum, gold and rhodium, it is harder to oxidize than a silver film, and is excellent in solderability. Accordingly, there is caused no defective contact between printed wiring board and equipments mounted thereon. Besides, the method of forming a silver alloy film, according to the invention, provides a silver alloy film which is uniform, flat and free of dispersion, because the degreasing treatment making use of a degreasing liquid and the specular treatment making use of a chemical polishing liquid are beforehand effected prior to the displacement plating. Accordingly, printed wiring board can be obtained which are suitable for high density mounting.

What is claimed is:

1. A silver alloy plating bath comprising at least silver ions and at least one metal ion selected from a group consisting of palladium ions, gold ions and rhodium ions, the silver ions and the at least one metal ion having a concentration of 0.001 to 0.01 mol/l, and a mole ratio of the at least one metal ion to the silver ion being 1:0.01 to 0.1.

2. The silver alloy plating bath according to claim 1, wherein the silver ions and the at least one metal ion have a concentration of 0.003 to 0.009 mol/l, and a mole ratio of the at least one metal ion to the silver ions is 1:0.3 to 0.09.

3. The silver alloy plating bath according to claim 2, wherein the silver ions and the at least one metal ion have a concentration of 0.005 to 0.007 mol/l, and a mole ratio of the at least one metal ion to the silver ions is 1:0.05 to 0.07.

4. The silver alloy plating bath according to any one of claims 1 to 3, further comprising a complexing agent and a surface active agent and having a pH of 6.0 to 10.0.

5. The silver alloy plating bath according to claim 4, wherein said complexing agent is ethylenediaminetetraacetic acid, diethylenetriaminepentaacetic acid, triethylenetetraaminehexaacetic acid, N-(2-hydroxylethyl) iminodiacetic acid, hydroxylethyl glycine, nitrilotriacetic acid or N-(2-hydroxylethyl)ethylenediaminetriacetic acid.

6. The silver alloy plating bath according to claim 4, wherein said complexing agent is aminotri (methylenephosphonic acid), ethylenediaminetetra (methylenephosphonic acid), hexanemethylenediaminetetra (methylenephosphonic acid) or nitrilotris (methylenephosphonic acid).

7. A method of forming a silver alloy film, comprising providing a substrate comprising on a surface thereof a more base metal than silver, and performing displacement plating with a bath of claim 1 to form a silver alloy film the more base metal than silver.

8. The method of forming a silver alloy film, according to claim 7, wherein surfaces of the more base metal than silver are subjected to degreasing treatment by means of a degreasing liquid prior to the displacement plating, and then treated with a chemical polishing liquid after displacement plating.

* * * * *